(12) United States Patent
Melanson

(10) Patent No.: US 7,660,839 B1
(45) Date of Patent: Feb. 9, 2010

(54) DIGITAL FILTER HAVING IMPROVED OVERLOAD RECOVERY CHARACTERISTICS

(75) Inventor: John Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 884 days.

(21) Appl. No.: 11/232,808

(22) Filed: Sep. 22, 2005

(51) Int. Cl.
    *G06F 17/10* (2006.01)
(52) U.S. Cl. .................................. 708/320; 708/306
(58) Field of Classification Search .............. 708/306, 708/320
    See application file for complete search history.

(56) References Cited

U.S. PATENT DOCUMENTS

| 4,223,389 | A | * | 9/1980 | Amada et al. .............. 708/306 |
| 4,920,507 | A | * | 4/1990 | Takeda ....................... 708/320 |
| 7,062,340 | B2 | | 6/2006 | Melanson |

OTHER PUBLICATIONS

Roberts, Richard A. and Mullins, Clifford T. "Digital Signal Processing", Addison-Wesley, Reading MA, 1987, pp. 297-316.

* cited by examiner

*Primary Examiner*—Chuong D Ngo
(74) *Attorney, Agent, or Firm*—Andrew M. Harris; Mitch Harris, Atty at Law, LLC

(57) ABSTRACT

A digital filter having improved overload characteristics provides improved performance in audio equalizers and other systems. In contrast to a standard digital filter, clipping is enforced at the output of the filter and an integrator is used to implement the first filter stage, which is then followed by another stage that may be a unit delay or an integrator. Scalers and combiners are provided to scale an input signal representation and the output signal representation and combine them to provide the particular coefficient inputs to the integrator and the second stage forming a direct form filter. The resulting filter implements the same transfer function as a corresponding direct form filter, with an improved recovery from internal overload conditions. Higher-order filters can be formed by cascading the second-order filters formed by multiple integrator/second stage pairs.

20 Claims, 6 Drawing Sheets

DIGITAL FILTER HAVING IMPROVED OVERLOAD RECOVERY CHARACTERISTICS

BACKGROUND OF THE INVENTION

1. Field of the Invention

The present invention relates generally to digital filters, and more specifically, to a method and circuit for direct-form digital filtering that has improved overload recovery characteristics.

2. Background of the Invention

Direct-form digital filters are used in many applications including audio circuits such as equalizers and other processing blocks. In particular, direct form II (DF-II) filters provide efficient implementations that require only N delay stages for an Nth order filter, but may overload at internal summing nodes of the filter.

At some predetermined input operating level, and at certain frequencies, many digital filters will overload at some point in the filter that exceeds the ability of the filter elements to properly represent internal state variables and/or external (output) signal levels. In particular, fixed-point filters have a range that is limited by the number of bits used to express the values within the filter. The overload condition by definition causes internal distortion in a digital filter's poles, even when the clipping occurs at the output combiner, as feedback from the output combiner is used in implementing the poles.

In a digital filter, clipping causes a prolonged error period to occur that takes much longer for recovery than in a corresponding analog filter. The clipping changes the transfer function of the filter, moving corner or center frequencies away from their design values, whereas in analog filters, clipping may only cause distortion and some loss Q factor. The movement of the filter frequencies not only causes improper operation, but contributes to the filters' slow recovery or possible total lack of recovery from the overload condition.

Therefore, it would be desirable to provide a digital filtering circuit and method for digital filtering that recover from an overload condition quickly and with minimal disruption.

SUMMARY OF THE INVENTION

The above stated objectives are achieved in a digital filter circuit and method. The digital filter comprises a first integrator stage followed by a second stage that may be a unit-delay or be an integrator. The first integrator stage receives a scaled combination of an input signal and the output of the second stage as input and the second stage receives the output of the first integrator stage combined with a scaled combination of the input signal and the output of the second stage. The second stage has a controlled clipping or compression level that provides the output of the digital filter and the above-mentioned scaled feedback values provided in the scaled combinations. Multiple second-order pairs of integrators and integrator/unit-delay stages can be cascaded to form higher order filters.

By controlling the location of clipping in the filter and making the first stage an integrator, when clipping does occur, distortion is reduced and recovery from the clipping condition is made more quickly. The second filter stage can be designed to clip the signal at a predetermined threshold or a separate clipping stage or programmatic step may be employed to enforce the clipping function. The first integrator stage has a feedback coefficient ranging between +0.8 and +1.0, providing substantially an integrating function. The second filter stage may likewise vary from a feedback value of zero (unit delay) or be substantially integrating (feedback value of +0.8 to +1.0).

The filter may be realized by a processor executing program instructions that implement a method that performs computations consistent with the above-described digital filter. Additionally the filter may be embodied in a computer program product comprising the program instructions as stored in or on a media.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a method and circuit that implement a digital filter having improved recovery characteristics over that of a similar prior art filter that implements the same transfer function. Therefore, the present invention is applicable in audio applications, or where digital filters otherwise suitable for use and require stable response in the face of overload conditions that could otherwise occur in the filter. The digital filter of the present invention controls the overload condition by forcing clipping (numerical saturation) to occur at the output of the second stage of the filter when a predetermined magnitude threshold is reached. The clipping may be introduced either by the design of the second stage (or programmatic step) or by a separate clipping block or step.

Figure 1:
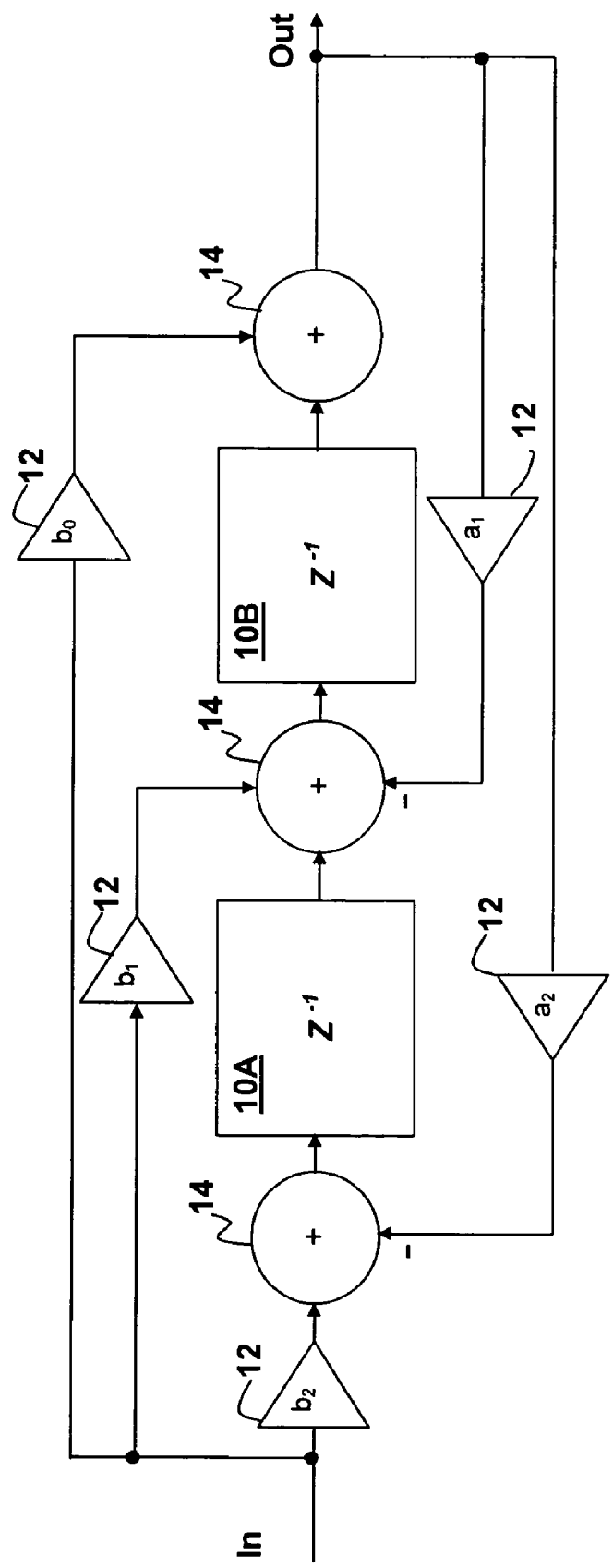
FIG. 1 is a block diagram depicting a prior art digital filter.

Referring now to FIG. 1, a prior art "transposed DF-II filter" is depicted in a block diagram. The filter includes adders 14 that act as combiners to combine scaled values of the input signal representation received at digital input In with scaled values of the output signal representation Out that is produced by the filter. Scaling blocks (multipliers) 12 provide the scaled input and output values, respectively that are provided to two cascaded unit delays 10A and 10B. The depicted filter implements the transfer function:

$$H(z) = \frac{b_0 + b_1 z^{-1} + b_2 z^{-2}}{1 + a_1 z^{-1} + a_2 z^{-2}},$$

which is a typical second order transfer function having two poles and two zeros.

The above-described prior art filter is suitable for use in digital audio and other applications. However, the internal summing nodes and/or the output may experience values that exceed the input or output values of the filter due to the arrangement of the elements and the values of the scaling coefficients that produce the above transform, particularly in implementations using fixed-point arithmetic. State variable plots provide a way of looking at the behavior of a digital filter response over time. Further details of state-variable plots and their use in describing the behavior of digital filters can be found in Roberts, R. A. and Mullis, C. F., "Digital Signal Processing", Addison-Wesley, Reading, Mass., 1987, which is incorporated herein by reference.

Figure 2:
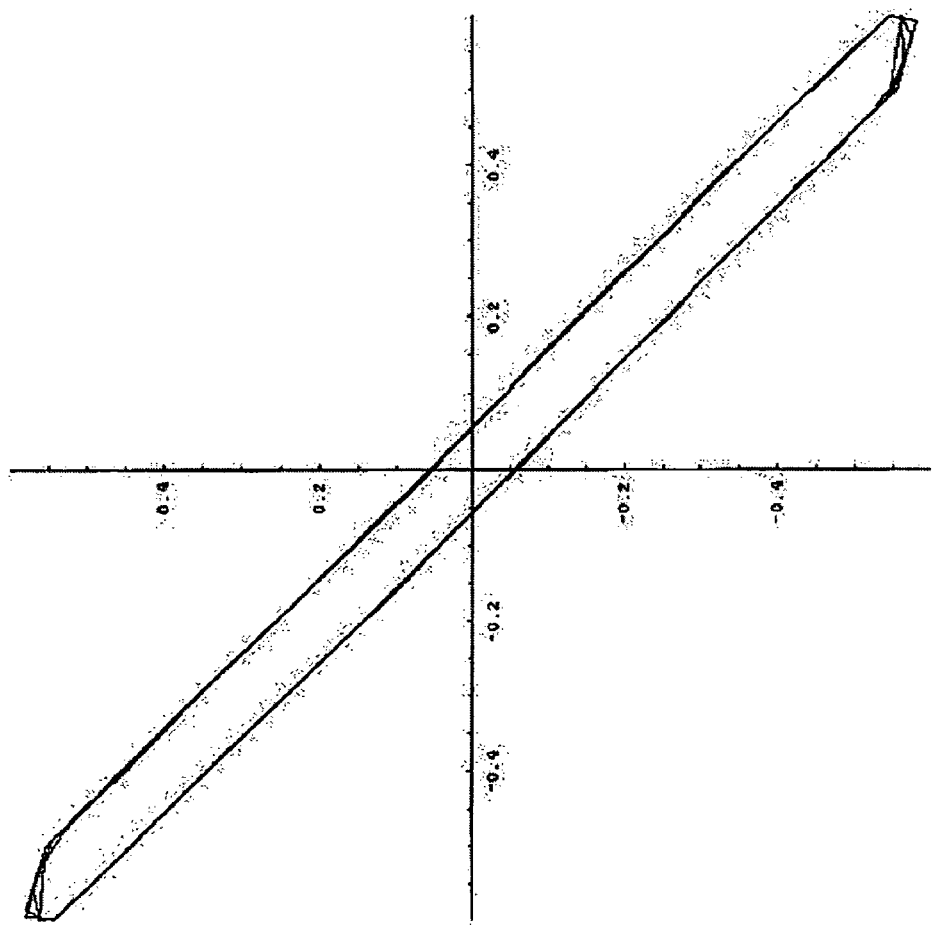
FIG. 2 is a state-variable plot describing the behavior of the prior art digital filter of FIG. 1 as the filter clips.

Referring to FIG. 2, a state-variable plot of the filter of FIG. 1 is shown. The state-variable plot of the above-described filter is elliptical and the major and minor axes vary with input frequency (or more properly as the ratio of the input frequency to the sampling frequency varies), making the diagram change from circular to linear as the input frequency changes. At the depicted single-tone operating frequency (i.e., for an injected sine wave), when numerical wraparound or clipping occurs in the filter (depending on the type of computation and number representation used), the ends of the ellipse are distorted. The distortion continues around the state-variable plot, showing that the filter can stay in an undesirable state for very long periods of time, due to a shift in the pole and zero frequencies produced by the clipping or numerical wrap-around.

Figure 3:
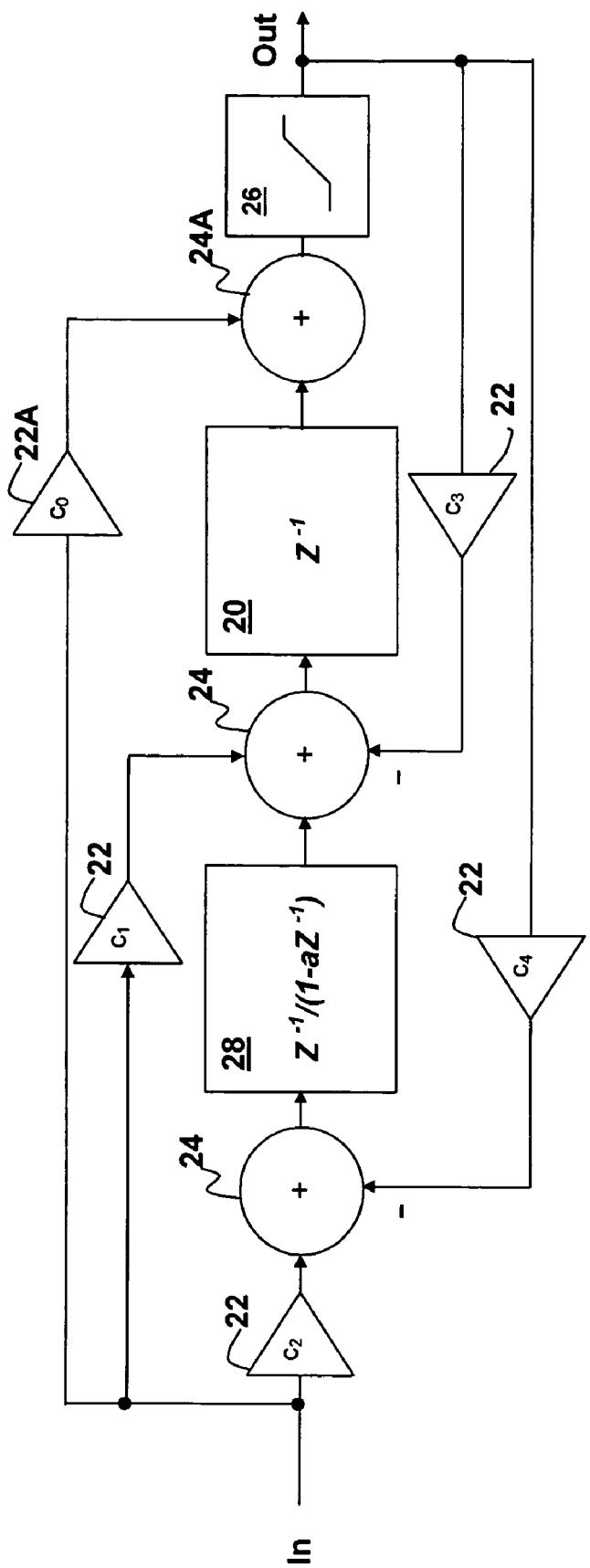
FIG. 3 is a block diagram depicting a digital filter in accordance with an embodiment of the present invention.

Referring now to FIG. 3, a filter in accordance with an embodiment of the present invention is depicted. The filter includes scalers 22 and combiners 24 as in the above-described filter, but having coefficients that differ, due to the use of an integrator 28 in the first stage of the filter delay line rather than a unit delay. The transfer function of integrator 28 can be given by:

$$z^{-1}/(1-az^{-1})$$

and the normalized feedback coefficient a of integrator 28 can be set between +0.8 and +1.0 and still substantially perform the function of integrating the signal representation provided at its input. It will be understood that the filter may alternatively implement the transfer function $1/(1-az^{-1})$ (non-delaying integrator) with the appropriate change in the coefficients.

A clipping stage 26 is either included after or designed into the output of an output combiner 24A so that when clipping occurs in the filter, it always occurs at the output of the filter, ensuring that all of the feedback values are clipped, and in a controlled manner. The clipping function is a non-linear operation that can be a hard clipping function that returns a positive constant value for input magnitudes above a predetermined positive threshold and a negative and generally symmetrical constant value for input magnitudes below a predetermined negative threshold. Alternatively, the clipping function can be a compression function (soft clipping) that attenuates the magnitude of the output when the above-described threshold is exceeded. Additionally, more than one threshold may be employed for each polarity. A polynomial based non-linearity such as $(3x-x^3)/2$ can be used to implement the clipping function, in order to simulate filters made from legacy components such as vacuum tubes.

A second stage 20 is depicted as implementing a transfer function of unit delay: $z^{-1}$, but generally operates as an integrator in fact, due to the fact that coefficient $c_3$ is generally negative and close to unity, the local feedback around second stage is close to that of a delaying integrator. However, feedback coefficient $c_3$ can be set to other values between 0 and +1.0, depending on the type of filter being implemented, as opposed to that of integrator 28, which is substantially an integrator in embodiments of the present invention. The actual value of feedback coefficient $c_3$ is determined by needs of the placement of filter poles and zeros and to control sensitivities and relative coefficient magnitudes.

Figure 4:
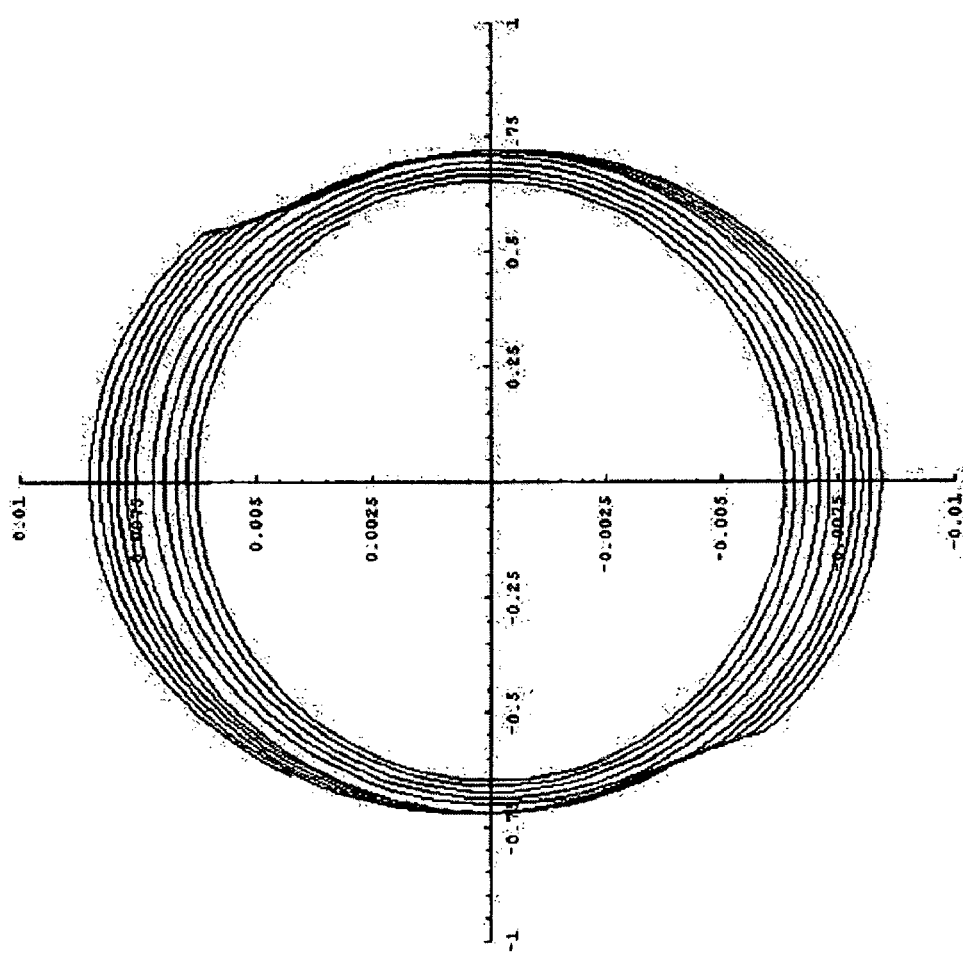
FIG. 4 is a state-variable plot describing the behavior of the digital filter of FIG. 3 as the filter clips.

The cascade of integrator 28 with second stage 20 moves the internal poles and zeros of the filter such that a nearly circular state-variable plot is produced over a wide range of frequencies, as can be observed in the state-variable plot of FIG. 4. When a=1, the depicted filter implements the transfer function:

$$H(z) = \frac{c_0 + c_1 z^{-1} + c_2 z^{-2}/(1-z^{-1})}{1 + c_3 z^{-1} + c_4 z^{-2}/(1-z^{-1})},$$

which is externally identical to the transfer function of the filter of FIG. 1, if $c_0=b_0$; $c_1=b_0+b_1$; $c_2=b_0+b_1+b_2$; $c_3=a_1-1$; and $c_4=a_1+a_2-1$.

Under overload conditions, when clipping stage 26 reduces the output signal magnitude, the filter of FIG. 3 maintains its nearly-circular state variable plot and exhibits fast recovery with a low level of overall disturbance once the overload condition is removed. The behavior of the filter of FIG. 3 after the overload is removed is seen as the state-variable plot proceeds toward the center of the graph in the plot of FIG. 4. Therefore, the above-described filter is preferable to the prior art filter of FIG. 1, in particular with respect to audio circuits and audio equalizer circuits, in which the disturbance will cause audible distortion of the signal. The above-described filter can be built using discrete logic as shown above or can be embodied in a method performed by program instructions executing within a dedicated digital signal processing system or a general-purpose computer system, as illustrated below.

Figure 5:
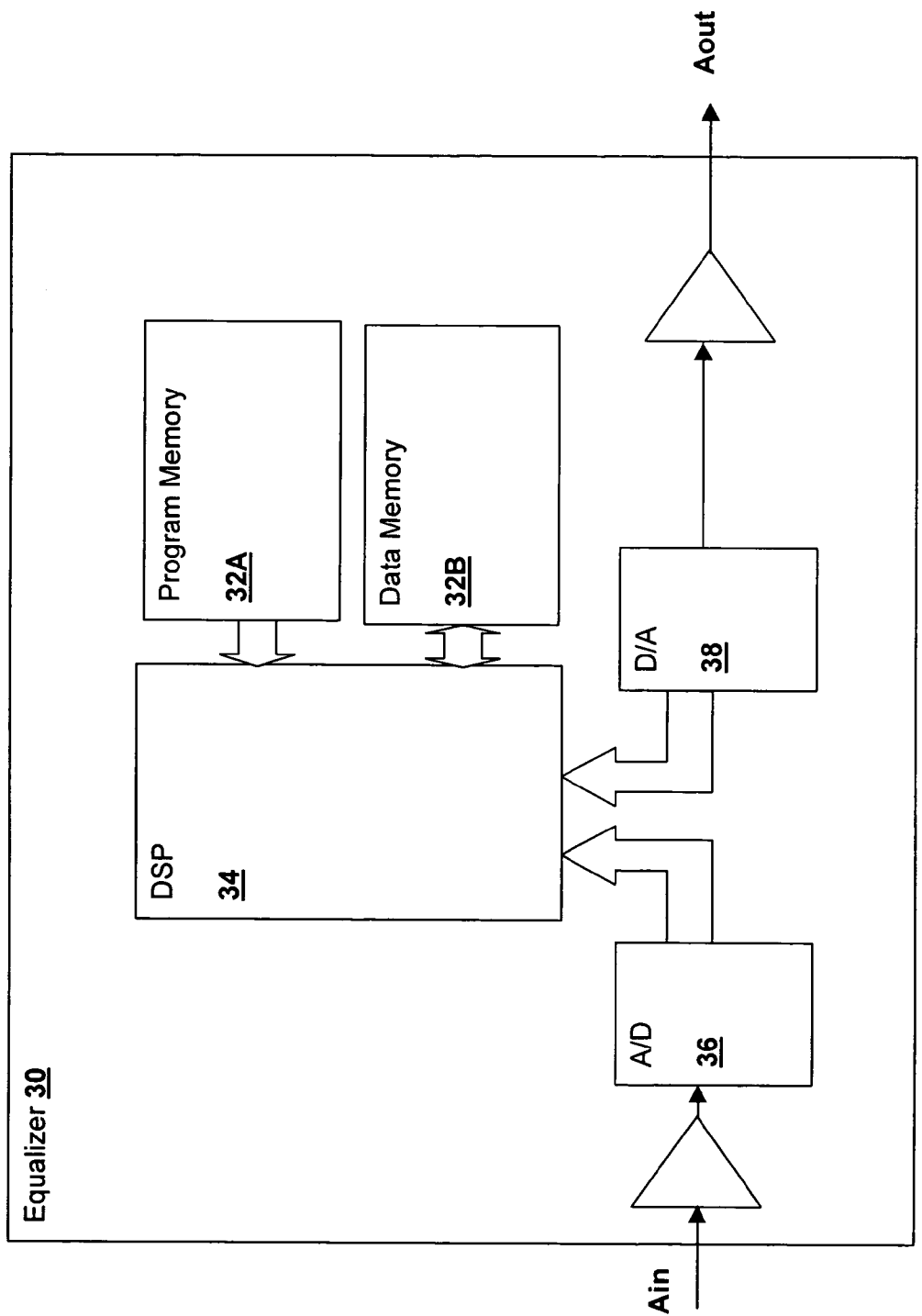
FIG. 5 is a block diagram of a processing system in accordance with an embodiment of the present invention.

Referring now to FIG. 5, an exemplary equalizer 30 system in accordance with an embodiment of the present invention is shown. An analog signal Ain is converted to a digital numeric representation by an analog-to-digital converter (A/D) 36. A digital signal processor (DSP) 34 executes program instructions stored in a program memory 32A that performs operations on values received from A/D converter 36 and values stored in a data memory 32B to compute an output value of one or more signals that is provided to an analog output Aout via a digital-to-analog converter (D/A) 38. For an equalizer function, the program code stored in program memory 32A and used to compute the output waveform representation(s) is generally code that implements multiple parallel bandpass filters corresponding to middle bands of the equalizer, along with a single lowpass and high pass filter for the extreme bottom end and high end of the processed spectrum, respectively.

Figure 6:
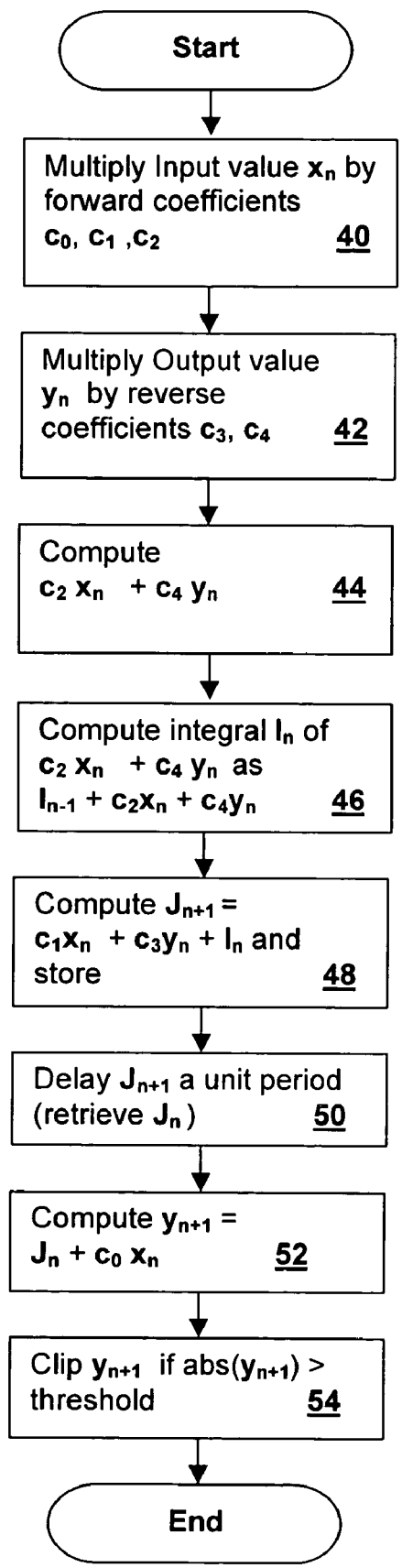
FIG. 6 is a flowchart depicting a method in accordance with an embodiment of the present invention.

The filter architecture described above with respect to FIG. 3 can be embodied in such program instructions as a computational method for converting an input signal representation to an output signal representation, and referring now to FIG. 6, such a method is illustrated in a flowchart. The illustrative example given below implements the filter of FIG. 3 wherein b=0 (unit delay) and a=1 (pure integrator or adder/accumulator), but it will be understood that the computations may be modified to accommodate other integrator feedback ratios.

First, the input value $x_n$ (each input sample) is multiplied by each of the forward coefficients: $c_0$, $c_1$ and $c_2$ (step 40). Next, the present output signal value $y_n$ as computed in the previous cycle (or initially some initial value such as two's-complement zero) is multiplied by the reverse coefficients: $c_3$ and $c_4$ (step 42). The input value to the integrator is computed as $c_2 x_n + c_4 y_n$ (step 44) and the integration can be made by computing $I_n = I_{n-1} + c_2 x_n + c_4 y_n$, where $I_{n-1}$ is the current value of the integrator before updating (step 46). Then the input value to the unit delay is calculated as $J_{n+1} = c_1 x_n + c_3 y_n + I_n$ (step 48), which is retained for use in the next output computation. The previous value $J_n$ is retrieved (step 50) (with suitable initial values substituted for startup cycles) and the prospective new filter output value is computed as $y_{n+1}=J_n+c_0 x_n$. (step 52). Finally, the resultant filter output $y_{n+1}$ is computed by applying the clipping function if the absolute value of $y_{n+1}$ is above the predetermined threshold and is provided as the output and stored as the next value of $y_n$.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A digital filter having improved overload handling characteristics, comprising:
    an input for receiving an input signal representation;
    an output for providing an output signal representation, said output having a non-linear amplitude reduction characteristic above a predetermined threshold amplitude level;
    a first stage implementing a digital integrator that receives a combination of scaled values of said input signal representation and said output signal representation;
    a second stage element that receives a combination of other scaled values of said input signal representation, said output signal representation and an output of said first stage element; and
    a combiner for combining an output of said second stage element with another scaled value of said input signal representation to provide said output signal representation.

2. The digital filter of claim 1, wherein said digital integrator implements the transfer function $z^{-1}/(1-az^{-1})$, where a is a value between 0.8 and 1.0.

3. The digital filter of claim 1, wherein a is equal to 1.

4. The digital filter of claim 1, wherein said second stage implements a unit delay.

5. The digital filter of claim 1, wherein said second stage further comprises a local feedback path coupling the output of the second stage to an input of the second stage and having a normalized feedback coefficient value between +0.8 and +1.0, whereby the second stage effectively implements a second digital integrator.

6. The digital filter of claim 1, wherein said non-linear amplitude reduction characteristic is a hard clipping function that produces a fixed magnitude level when the target magnitude value for said output is above said predetermined threshold amplitude level.

7. The digital filter of claim 1, wherein said non-linear amplitude reduction characteristic is a compression function attenuates said output when the target magnitude value for said output is above said predetermined threshold amplitude level.

8. The digital filter of claim 1, wherein the digital filter implements the transfer function:

$$(b_0+b_1 z^{-1}+b_2 z^{-2})/(1+a_1 z^{-1}+a_2 z^{-2})$$

where $c_0=b_0$, $c_1=b_0+b_1$, $c_2=b_0+b_1+b_2$, $c_3=a_1-1$, and $c_4=a_1+a_2-1$, wherein $c_0$ is the coefficient by which said another scaled value of said input signal representation provided to said combiner is scaled, $c_1$ is the coefficient by which said other scaled value of said input signal representation provided to said second stage is scaled, $c_2$ is the coefficient by which said scaled value of said input signal representation provided to said first stage is scaled, $c_3$ is the coefficient by which said other scaled value of said output signal representation provided to said second stage is scaled and $c_4$ is the coefficient by which said scaled value of said output signal representation provided to said integrator is scaled.

9. A method of computing a digital filter result, comprising:
    receiving an input signal representation at the input of a digital filter;
    providing an output signal representation at the output of a digital filter;
    scaling said input signal representation by a first plurality of values to provide a set of forward terms;
    scaling said output signal representation by a second plurality of values to provide a set of reverse terms;
    digitally integrating a combination of a first one of said set of forward terms and a second one of said set of reverse terms;
    delaying a combination of a third one of said set of forward terms and a fourth one of said set of reverse terms along with a result of said digitally integrating;
    combining a result of said delaying with a fifth one of said set of forward terms to produce an output result; and
    applying a non-linear amplitude reduction to said output result if said output result exceeds a predetermined magnitude to produce said output signal representation at the output of the digital filter.

10. The method of claim 9, wherein said delaying delays said combination of said third one of said forward terms and said fourth one of said reverse terms along with said result of said digitally integrating and further in combination with a result of said delaying, whereby said delaying substantially performs a second digital integration.

11. The method of claim 9, wherein said scaling along with said integrating, delaying and combining implement a second-order bandpass function providing one of multiple parallel stages in a digital equalizer.

12. The method of claim 9, wherein said scaling along with said integrating, delaying and combining implement the transfer function:

$$(b_0+b_1 z^{-1}+b_2 z^{-2})/(1+a_1 z^{-1}+a_2 z^{-2})$$

where $c_0=b_0$, $c_1=b_0+b_1$, $c_2=b_0+b_1+b_2$, $c_3=a_1-1$, and $c_4=a_1+a_2-1$, and wherein $c_0$, $c_1$ and $c_2$ are the first plurality of values and $c_3$ and $c_4$ are the second plurality of values.

13. A system, comprising a processor and a memory coupled to said processor for storing program instructions implementing a digital filter, wherein said program instructions comprise program instructions for:
    receiving an input signal representation;
    providing an output signal representation;
    scaling said input signal representation by a first plurality of values to provide a set of forward terms;
    scaling said output signal representation by a second plurality of values to provide a set of reverse terms;
    digitally integrating a combination of a first one of said set of forward terms and a second one of said set of reverse terms;
    delaying a combination of a third one of said set of forward terms and a fourth one of said set of reverse terms along with a result of said digitally integrating;
    combining a result of said delaying with a fifth one of said set of forward terms to produce an output result; and
    applying a non-linear amplitude reduction to said output result if said output result exceeds a predetermined magnitude to produce said output signal representation.

14. The system of claim 13, wherein said program instructions for delaying delay said combination of said third one of said forward terms and said fourth one of said reverse terms along with said result of said digitally integrating and further in combination with a result of said delaying, whereby said program instructions for delaying substantially perform a second digital integration.

15. The system of claim 13, wherein said program instructions for scaling along with said program instructions for integrating, delaying and combining implement a second-order bandpass function providing one of multiple parallel stages in a digital equalizer.

16. The system of claim 13, wherein said program instructions for scaling along with said program instructions for integrating, delaying and combining implement the transfer function: $(b_0+b_1z^{-1}+b_2z^{-2})/(1+a_1z^{-1}+a_2z^{-2})$, where $c_0=b_0$, $c_1=b_0+b_1$, $c_2=b_0+b_1+b_2$, $c_3=a_1-1$, and $c_4=a_1+a_2-1$, and wherein $c_0$, $c_1$ and $c_2$ are the first plurality of values and $c_3$ and $c_4$ are the second plurality of values.

17. A computer program product comprising a computer readable storage media storing program instructions for execution within a processing system, said program instructions comprising program instructions for:
  receiving an input signal representation,
  providing an output signal representation,
  scaling said input signal representation by a first plurality of values to provide a set of forward terms,
  scaling said output signal representation by a second plurality of values to provide a set of reverse terms,
  digitally integrating a combination of a first one of said set of forward terms and a second one of said set of reverse terms,
  delaying a combination of a third one of said set of forward terms and a fourth one of said set of reverse terms along with a result of said digitally integrating;
  combining a result of said delaying with a fifth one of said set of forward terms to produce an output result, and
  applying a non-linear amplitude reduction to said output result if said output result exceeds a predetermined magnitude to produce said output signal representation.

18. The computer program product of claim 17, wherein said program instructions for delaying delay said combination of said third one of said forward terms and said fourth one of said reverse terms along with said result of said digitally integrating and further in combination with a result of said delaying, whereby said program instructions for delaying substantially perform a second digital integration.

19. The computer program product of claim 17, wherein said program instructions for scaling along with said program instructions for integrating, delaying and combining implement a second-order bandpass function providing one of multiple parallel stages in a digital equalizer.

20. The computer program product of claim 17, wherein said program instructions for scaling along with said program instructions for integrating, delaying and combining implement the transfer function $(b_0+b_1z^{-1}+b_2z^{-2})/(1+a_1z^{-1}+a_2z^{-2})$, where $c_0=b_0$, $c_1=b_0+b_1$, $c_2=b_0+b_1+b_2$, $c_3=a_1-1$, and $c_4=a_1+a_2-1$, and wherein $c_0$, $c_1$ and $c_2$ are the first plurality of values and $c_3$ and $c_4$ are the second plurality of values.

* * * * *